United States Patent
Darolia et al.

(10) Patent No.: US 7,455,890 B2
(45) Date of Patent: *Nov. 25, 2008

(54) ION IMPLANTATION OF TURBINE ENGINE ROTOR COMPONENT

(75) Inventors: Ramgopal Darolia, West Chester, OH (US); Michael James Weimer, Loveland, OH (US)

(73) Assignee: General Electric Company, Schenectady, NY (US)

( * ) Notice: Subject to any disclaimer, the term of this patent is extended or adjusted under 35 U.S.C. 154(b) by 945 days.

This patent is subject to a terminal disclaimer.

(21) Appl. No.: 10/634,543

(22) Filed: Aug. 5, 2003

(65) Prior Publication Data

US 2005/0031794 A1  Feb. 10, 2005

(51) Int. Cl.
*C23C 14/48* (2006.01)
*C23C 14/16* (2006.01)

(52) U.S. Cl. .................. 427/528; 427/531; 427/527

(58) Field of Classification Search .............. None
See application file for complete search history.

(56) References Cited

U.S. PATENT DOCUMENTS

| | | | | |
|---|---|---|---|---|
| 3,857,682 | A * | 12/1974 | White .................. | 428/610 |
| 4,078,951 | A | 3/1978 | Denzine et al. | |
| 4,137,370 | A * | 1/1979 | Fujishiro et al. ......... | 428/660 |
| 4,433,005 | A * | 2/1984 | Manty et al. ............. | 427/528 |
| 4,568,396 | A | 2/1986 | Vardiman | |
| 4,775,548 | A * | 10/1988 | Lankford, Jr. ........... | 427/527 |
| 4,919,773 | A * | 4/1990 | Naik ....................... | 205/170 |
| 5,077,140 | A | 12/1991 | Luthra et al. | |
| 5,098,540 | A | 3/1992 | McKee | |
| 5,580,669 | A * | 12/1996 | Beers et al. ............. | 428/660 |
| 5,660,885 | A | 8/1997 | Hasz et al. | |
| 5,780,110 | A | 7/1998 | Schaeffer et al. | |
| 5,879,760 | A * | 3/1999 | Eylon et al. ............. | 427/528 |
| 5,900,283 | A | 5/1999 | Vakil et al. | |
| 6,123,997 | A | 9/2000 | Schaeffer et al. | |
| 6,273,678 | B1 * | 8/2001 | Darolia .................. | 415/200 |
| 6,283,714 | B1 * | 9/2001 | Rigney et al. ........... | 416/241 R |

(Continued)

FOREIGN PATENT DOCUMENTS

EP  0 240 110 A  10/1987

(Continued)

OTHER PUBLICATIONS

Translation of Hayashi et al., JP 02-015164, published Jan. 1990.*

(Continued)

*Primary Examiner*—Marianne L Padgett
(74) *Attorney, Agent, or Firm*—Hasse & Nesbitt LLC; Donald E. Hasse

(57) ABSTRACT

A turbine engine rotor component, such as a compressor or turbine disk or seal element, is protected from corrosion by implanting aluminum or chromium ions, or mixtures thereof, on the surface of the component. Additional metal ions, such as rare earth and reactive elements, may also be implanted on the surface of the component. The component may be heated in a nonoxidizing atmosphere at a specified temperature and time to diffuse the ions into the surface. The component is typically then heated or maintained at an elevated temperature in the presence of oxygen to form an oxide coating on the surface of the component.

17 Claims, 2 Drawing Sheets

U.S. PATENT DOCUMENTS

| | | | |
|---|---|---|---|
| 6,436,473 B2 * | 8/2002 | Darolia et al. | 427/252 |
| 6,532,657 B1 * | 3/2003 | Weimer et al. | 29/889.2 |
| 6,617,049 B2 * | 9/2003 | Darolia et al. | 428/633 |
| 6,620,525 B1 * | 9/2003 | Rigney et al. | 428/633 |
| 6,632,480 B2 * | 10/2003 | Darolia et al. | 427/404 |
| 6,720,088 B2 * | 4/2004 | Zhao et al. | 428/615 |
| 6,767,657 B1 * | 7/2004 | Nagasaka et al. | 428/698 |
| 6,797,335 B1 * | 9/2004 | Paderov et al. | 427/530 |
| 6,926,928 B2 | 8/2005 | Ackerman et al. | |
| 6,964,791 B2 * | 11/2005 | Zhao et al. | 427/405 |
| 7,087,266 B2 * | 8/2006 | Darolia et al. | 427/255.32 |
| 7,229,675 B1 * | 6/2007 | Paderov et al. | 427/529 |
| 7,364,801 B1 * | 4/2008 | Hazel et al. | 428/632 |

FOREIGN PATENT DOCUMENTS

| | | | |
|---|---|---|---|
| GB | 2241961 A | * | 9/1991 |
| JP | 62-174377 | * | 7/1987 |
| JP | 02-015164 | * | 1/1990 |

OTHER PUBLICATIONS

Translation of Murakami et al., JP 62-174377, published Jul. 1987.*
Dodd, A. et al., "The effect of ion implantation on the fatigue life and corrosion resistance of M50 steel bearings," Surface and Coatings Technology, vol. 74-75, No. 1-32 (1995), pp. 754-759, no month.
EPO & JPO abstracts of JP 02-015164 A, published Jan. 18, 1990.
EPO & JPO abstracts of JP 62-174377 A, published Jul. 31, 1987.

* cited by examiner

ION IMPLANTATION OF TURBINE ENGINE ROTOR COMPONENT

BACKGROUND OF THE INVENTION

The present invention relates to a method for improving corrosion resistance of a turbine engine component. More particularly, the invention relates to implanting aluminum ions, chromium ions, or mixtures thereof, and optionally other metal ions, on the surface of a turbine engine rotor component, such as a compressor or turbine disk, seal element or shaft. The component is typically then heated or maintained at an elevated temperature in the presence of oxygen to form a protective oxide coating on the surface of the component. The invention also relates to such a rotor component comprising a metal-based substrate having implanted aluminum or chromium ions on the surface of the substrate.

In an aircraft gas turbine engine, air is drawn into the front of the engine, compressed by a shaft-mounted compressor, and mixed with fuel. The mixture is burned, and the hot exhaust gases are passed through a turbine mounted on the same shaft. The flow of combustion gas turns the turbine by impingement against the airfoil section of the turbine blades, which turns the shaft and provides power to the compressor. The hot exhaust gases flow from the back of the engine, driving it and the aircraft forward. The hotter the combustion and exhaust gases, the more efficient is the operation of the jet engine. Thus, there is incentive to raise the combustion gas temperature.

The turbine engine includes compressor and turbine disks (sometimes termed compressor and turbine rotors), a number of blades mounted to the compressor and turbine disks and extending radially outwardly therefrom into the gas flow path, and rotating seal elements that channel the airflow and prevent the hot combustion gases from contacting the turbine shaft and related components. As the maximum operating temperature of the turbine engine increases, the compressor and turbine disks and seal elements are subjected to higher temperatures. As a result, oxidation and corrosion of the disks and seal elements have become of greater concern. Alkaline sulfate deposits resulting from ingested dirt and sulfur in the combustion gas are a major source of the corrosion, but other elements in the aggressive combustion and bleed gas environment may also accelerate the corrosion. The oxidation and corrosion damage may lead to premature removal and replacement of the disks and seal elements unless the damage is reduced or repaired.

Turbine and compressor disks and seal elements for use at the highest operating temperatures are made of nickel-base superalloys selected for good elevated temperature strength and fatigue resistance. These superalloys are selected for their mechanical properties. They have adequate resistance to oxidation and corrosion damage, but that resistance is not sufficient to protect them at the operating temperatures now being reached. Disks and other rotor components made from newer generation alloys may also contain lower levels of aluminum and chromium, and may be more susceptible to corrosion attack.

Turbine and compressor disks and seal elements typically have not been coated to protect them against oxidation and corrosion. A number of oxidation-resistant and corrosion-resistant coatings have been considered for use on turbine blades. These turbine blade coatings are generally too thick and heavy for use on disks and seal elements, and also may adversely affect the fatigue life of the disks and seal elements. There remains a need for protecting disks, seal elements, and other rotor components against oxidation and corrosion as their operating temperatures increase.

BRIEF DESCRIPTION OF THE INVENTION

In one aspect, this invention relates to a method for improving corrosion resistance of a turbine engine rotor component, the method comprising the step of implanting aluminum ions, chromium ions, or mixtures thereof on the surface of the component.

In another aspect, this invention relates to a method for improving corrosion resistance of a turbine engine rotor component, comprising the steps of:
 (a) providing a rotor component selected from the group consisting of compressor and turbine disks and seal elements;
 (b) implanting aluminum ions, chromium ions, or mixtures thereof on the surface on the rotor component to a depth of up to about 2 microns; and
 (c) heating the implanted component in the presence of oxygen to form an oxide coating on the surface of the component.

The invention also relates to a turbine engine rotor component having improved corrosion resistance comprising a metal-based substrate having implanted aluminum ions, chromium ions, or mixtures thereof on the surface of the substrate.

Additional metal ions, such as ions or rare earth and reactive elements may also be implanted on the surface of the component to further improve the protective oxide coating formed on the surface of the component.

DETAILED DESCRIPTION OF THE INVENTION

Figure 1:
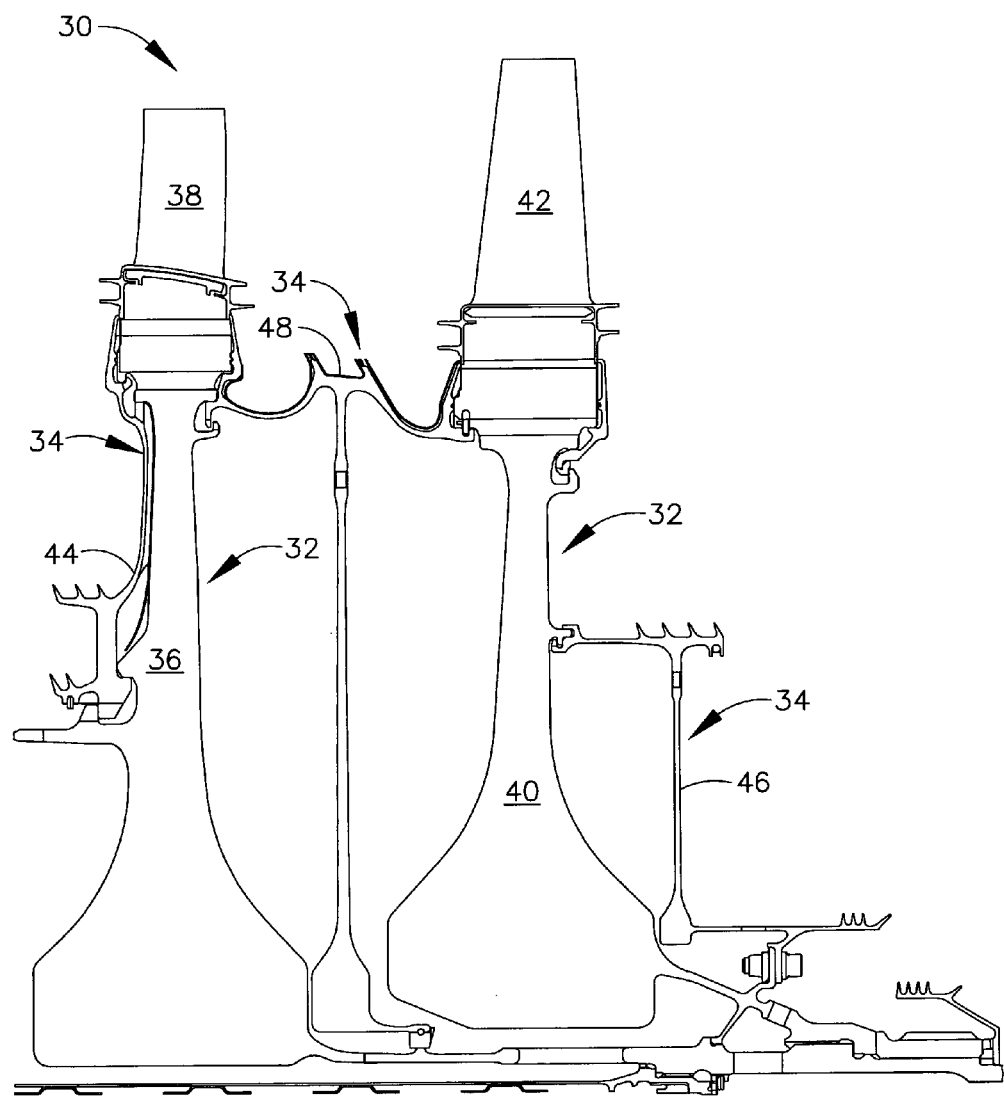
FIG. 1 is a schematic view of a portion of the turbine section of a gas turbine engine.

The invention provides a method for improving the corrosion resistance of a turbine engine rotor component used at a moderately elevated service operating temperature. The approach allows the mechanical performance of the rotor component to be optimized using the best available alloy. The selected alloy is protected against environmental damage by implanting aluminum ions or chromium ions, or mixtures thereof, to enrich the surface of the rotor component in aluminum and/or chromium. The component is then heated or maintained at an elevated temperature in the presence of oxygen to form a protective aluminum oxide and/or chromium oxide coating on the surface of the component. Additional metal ions, such as ions of rare earth and reactive elements, may also be implanted to improve adherence of the aluminum oxide and/or chromium oxide coating. The protective coating formed is highly adherent, does not adversely affect the properties of the underlying base metal, and is thin so that it does not significantly alter the dimensions of the component to which it is applied. The protective coating can also be readily reconditioned and repaired if necessary.

While not intending to be limited by theory, it is believed that aluminum oxide coatings are particularly effective at preventing high temperature corrosion, and that chromium oxide coatings are particularly effective at preventing Type 2 corrosion at lower temperatures. Thus, one may implant aluminum ions or chromium ions, and select the concentration of implanted ions, based on the particular corrosion problems expected during operation of the turbine engine rotor component. In some embodiments, implanting mixtures of aluminum and chromium ions may provide an oxide coating that is more effective at preventing corrosion under a variety of operating conditions experience by such a rotor component.

In other embodiments, one or more additional metal ions selected from the group consisting of scandium, yttrium, lanthanum, cerium, hafnium, tantalum, and zirconium, and mixtures thereof, may be implanted to improve adherence of the aluminum oxide and/or chromium oxide coating.

Of the above, yttrium, cerium, zirconium or hafnium, or mixtures thereof, are typically used. In another embodiment, silicon ions may also be implanted, with or without one or more of the other metal ions mentioned above, to improve the protective oxide coating formed on the surface of the component.

The turbine engine rotor component may be of any type, but the present approach is particularly advantageous when used to protect rotor components or portions thereof that experience a service operating temperature of from about 540° C. to about 815° C. Examples of particular interest include all or part of a turbine or compressor disk or seal element. The entire rotor component need not be protected in many cases. For example, the mid-to-outer portion of the hub of the turbine disk may be coated, while the bore region, inner portion of the hub, and blade slots may or may not be coated.

The method of the invention comprises the step of implanting aluminum ions or chromium ions, or mixtures thereof, and optionally one or more of the additional metal ions mentioned above, on the surface of the rotor component. The ions can be implanted by various methods known in the art. In a typical implanter, a chamber holds a source gas that is ionized to produce a plasma. The ions formed are continuously extracted through electrical charge attraction and accelerated through a voltage difference V. This gives each ion an energy $E=qV$, where q is the charge of the ion. Typical acceleration voltages are 10,000 to 500,000 electron volts (eV). The ion beam is then passed through a transverse magnetic field so that the different mass ions of energy E will be deflected by different angles. In this way, ions of particular energy and mass are selected. Varying electric fields are often used to sweep the selected ion beam laterally so that an area can be uniformly implanted with the ions. The region between the ion source and the solid target is kept under vacuum since the ions travel only very short distances in air. The total number of ions incident on the target is determined by measuring the current to the sample for ion implantation. By integrating this current to obtain the total ion charge and using the known charge per ion, the number of ions implanted in the target can be controlled.

An aluminum ion beam, for example, can implant $10^{15}$ to $10^{17}$ aluminum ions/cm$^2$ at an energy of 175 KeV. The current of the beam that is aimed onto the sample is usually between 100 and 500 microamps, but can be less than or greater than this range. The lower the current the longer the beam must be maintained in order to reach the desired number of ions per square centimeter. One consequence of using a higher current is heating of the sample. If a high current is used, the sample typically is not allowed to reach a temperature greater than about 700° C. By properly heat sinking the sample, the temperature can be controlled. The ion implantation is generally conducted at a temperature of from about 20° C. to about 700° C., typically from about 20° C. to about 500° C., more typically from about 20° C. to about 320° C. The ions are implanted to a depth of up to about 2 microns, typically up to about 1 micron, and more typically from about 0.1 to about 0.5 microns. Implantation at higher temperatures within the above range, and at higher doses or concentrations, typically results in implanting ions at greater depths into the substrate, which can prolong the life of the protective oxide coating on the turbine engine rotor component.

After implanting the selected ions, or simultaneously with implantation, the component can be heated in a nonoxidizing atmosphere, e.g., a gas such as helium or argon, and typically in a vacuum, to a temperature of from about 500° C. to about 800° C., typically from about 600° C. to about 700° C., more typically from about 640° C. to about 700° C., to diffuse the ions into the substrate of the component. Depending on the temperature and composition of the rotor component, this step may occur over a wide range in time, e.g., from about 10 minutes to about 24 hours, but typically from about 0.5 to about 10 hours, more typically from about 2 hours to about 8 hours. Alternatively, this heating step may occur simultaneously with the step of implanting the ions on the surface of the rotor component.

The rotor component is then heated or maintained at an elevated temperature (e.g., about 450° C. to about 800° C., typically from about 600° C. to about 700° C., more typically from about 650° C. to about 700° C., in the presence of oxygen to form the desired oxide coating on the surface of the component. The oxide coating may be grown on a substrate simply by exposing it to an oxidizing environment, either as part of the manufacturing operation or in service during operation of the turbine engine. In one embodiment, the rotor component is heated or maintained at the above temperature range in a controlled partial pressure of oxygen, for example, from about $10^{-2}$ to about $10^{-5}$ torr, to form the desired oxide coating. In a typical case, the step of oxidizing the component includes heating the component to a temperature within the above range for a time of from about 2 to about 8 hours, typically at least about 4 hours.

Other features and advantages of the present invention will be apparent from the following more detailed description, taken in conjunction with the accompanying drawings. The scope of the invention is not, however, limited to the described embodiments.

A turbine engine rotor component 30, an example of which is illustrated in FIG. 1, is provided. The rotor component 30 may be of any operable type, for example, a turbine disk 32 or a turbine seal element 34. FIG. 1 schematically illustrates a stage 1 turbine disk 36, a stage 1 turbine blade 38 mounted to the turbine disk 36, a stage 2 turbine disk 40, a stage 2 turbine blade 42 mounted to the turbine disk 40, a forward seal 44, an aft seal 46, and an interstage seal 48. Any or all of these turbine disks 32 and/or turbine seal elements 34 may be provided for coating by the present approach, depending upon whether corrosion is expected or observed. In a typical case, only a portion of the selected rotor component 30 is coated. The turbine blades 38 and 42 are not coated by the present approach.

The turbine engine rotor component is usually made of a nickel-base alloy, typically a nickel-base superalloy. A nickel-base alloy has more nickel than any other element. A nickel-base superalloy is strengthened by the precipitation of gamma prime or a related phase. A nickel-base superalloy of interest is available by the trade name René 88, which has a nominal composition, by weight of 13% cobalt, 16% chromium, 4% molybdenum, 3.7% titanium, 2.1% aluminum, 4% tungsten, 0.70% niobium, 0.015% boron, 0.03% zirconium, and 0.03 percent carbon, with the balance nickel and minor impurities.

Figure 2:
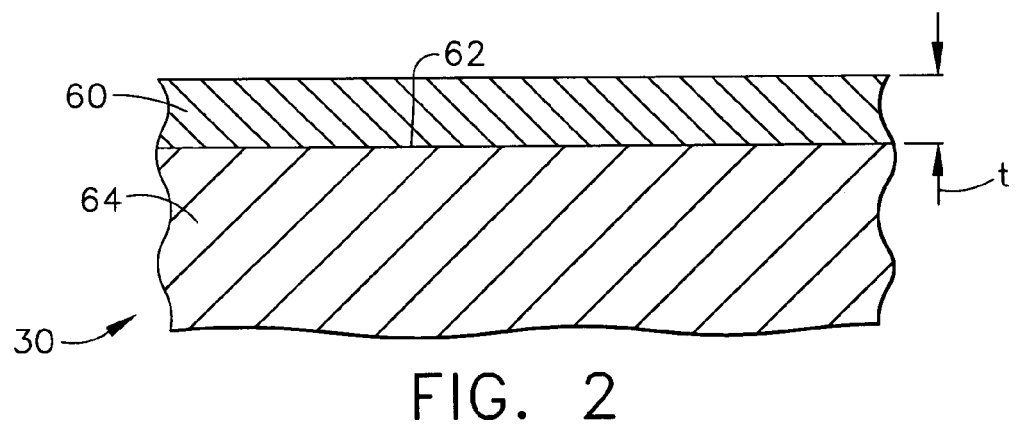
FIG. 2 is a schematic view of an oxide coating formed on a rotor component substrate.

An aluminum oxide or chromium oxide coating is formed on the rotor component 30 by implanting aluminum ions, chromium ions, or mixtures thereof on the surface of the component, and then exposing the component to oxygen at an elevated temperature, as described above. FIG. 2 illustrates such an oxide coating 60 formed on a surface 62 of turbine engine rotor component 30, which thereby serves as a substrate 64 for the oxide coating. The oxide coating typically has a thickness t of from about 0.5 to about 5 microns, although the coating usually has a thickness of from about 0.5 to about 3 microns. The oxide coating 60 typically is relatively thin to avoid significantly altering the dimensions of the coated component. However, if the oxide coating is too thin, such as less than about 0.5 microns, there may be incomplete coverage of the surface 62 (i.e., bare spots) and insufficient thickness to resist oxidation and corrosion of the protected substrate 64. A thickness of the oxide coating in the range of about 0.5 to about 3 microns, typically about 1 to about 2 microns, provides a balance of good adhesion of the coating to the surface and good protection of the substrate.

The oxide coating 60 is typically formed on the surfaces 62 of those portions of rotor component 30 that experience a service operating temperature of from about 540° C. to about 815° C. The oxide coating 60 is usually not needed on those portions, such as the portions of turbine disk 32 near the center bore, whose service operating temperature is less than about 540° C. because the natural oxidation and corrosion resistance of the materials of construction provide sufficient resistance. In that case, the oxide coating 60 is an unnecessary weight and expense. More complex protective coatings, such as thicker aluminide diffusion coatings or overlay coatings, and optionally thermal barrier coatings, are often used on those portions of turbine engine components whose service operating temperature is greater than about 815° C.

One feature of the process of the invention is that the rotor component 30 upon which the oxide coating 60 is formed is heated to a relatively low temperature during the process. The rotor component 30 is typically a forged or otherwise mechanically worked alloy, which is subjected to heat treatments and other processing to attain specific microstructures and other structures that are beneficial to subsequent functionality. A high temperature could adversely affect this structure. The temperature to which the rotor component 30 is heated depends upon the coating being formed. In many cases, however, that temperature is in the range of about 600° C. to about 700° C., below the expected service operating temperature of the coated portion of the rotor component 30. In some cases, the process temperatures are higher, but these are used with care and consideration to avoid adverse effects on the underlying rotor component 30.

While the above embodiments have been described in the context of turbine engine disks, the present invention can be used to form an aluminum oxide or chromium oxide coating on surfaces of various turbine engine rotor components, including compressor disks, seals, and shafts.

The following examples illustrate some embodiments of this invention, but should not be construed to be any sort of limitation on its scope. In the examples, the test disks are high-pressure gas turbine engine components made from a nickel-based superalloy, available by the trade name René 88.

EXAMPLE 1

A process of the invention is used to form an aluminum oxide coating on turbine disks. In the process, aluminum ions are implanted on the surface of the disk (initially at ambient temperature) at a dose of about $10^{17}$ ions per cm$^2$ at 150 KeV energy. The disks are then heated to a temperature of about 700° C. for 8 hours in the presence of oxygen at a partial pressure of about $10^{-3}$ torr to form an oxide protective coating on the surface of the disks. The oxide coating formed has a thickness of about 0.5 microns.

EXAMPLE 2

A process of the invention is used to form an aluminum oxide coating on turbine seal elements. In the process, aluminum ions are implanted on the surface of the seal elements (initially at ambient temperature) at a dose of about $10^{17}$ ions per cm$^2$ at 150 KeV energy. The seal elements are heated to a temperature of about 700° C. for 8 hours in the presence of oxygen at a partial pressure of about $10^{-3}$ torr to form an oxide protective coating on the surface of the seal elements. The oxide coating formed has a thickness of about 0.5 microns.

EXAMPLE 3

A process of the invention is used to form a chromium oxide coating on turbine disks. In the process, the chromium ions are implanted on the surface of the disk (initially at ambient temperature) at a dose of about $10^{17}$ ions per cm$^2$ at 150 KeV energy. The disks are then heated to a temperature of about 700° C. for 8 hours in the presence of oxygen at a partial pressure of about $10^{-3}$ torr to form an oxide protective coating on the surface of the disks. The oxide coating formed has a thickness of about 0.5 microns.

In the above examples, additional metal ions, typically selected from the group consisting of yttrium ions, cerium ions, zirconium ions, hafnium ions, silicon ions, and mixtures thereof, can be implanted on the surface of the turbine engine rotor components and an oxide coating formed under similar conditions.

Various embodiments of this invention have been described. However, this disclosure should not be deemed to be a limitation on the scope of the invention. Accordingly, various modifications, adaptations, and alternatives may occur to one skilled in the art without departing from the spirit and scope of the claimed invention.

What is claimed is:

1. A method for improving corrosion resistance of a turbine engine rotor component, wherein the rotor component is a compressor disk, a compressor seal element, a turbine disk or a turbine seal element, said rotor component being made of a nickel-base alloy and having a service operating temperature of from about 540° C. to about 815° C., said rotor component not being coated to protect it from oxidation and corrosion, the method comprising the step of implanting aluminum ions, chromium ions, or mixtures thereof into the surface of the rotor component.

2. The method of claim 1 further comprising implanting yttrium ions, cerium ions, zirconium ions, hafnium ions, or silicon ions, or mixtures thereof, into the surface of the rotor component.

3. The method of claim 1 wherein the ions are implanted to a depth of up to about 2 microns.

4. The method of claim 3 wherein the ions are implanted to a depth of from about 0.1 to about 0.5 microns.

5. The method of claim 1 wherein the ion implantation is conducted at a temperature of from about 20° C. to about 700° C.

6. The method of claim 5 wherein the ion implantation is conducted at a temperature of from about 20° C. to about 320° C.

7. The method of claim 6 wherein the ions are implanted to a depth of from about 0.1 to about 0.5 microns.

8. The method of claim 7 further comprising the step of heating the implanted rotor component in a nonoxidizing atmosphere to a temperature of from about 600° C. to about 700° C. to diffuse the ions into the surface of the rotor component.

9. The method of claim 1 further comprising the step of heating the implanted rotor component in a nonoxidizing atmosphere to a temperature of from about 500° C. to about 800° C. to diffuse the ions into the surface of the rotor component.

10. The method of claim 1 further comprising the step of heating the implanted rotor component at a temperature of from about 450° C. to about 800° C. in the presence of oxygen to form an oxide coating on the surface of the rotor component.

11. The method of claim 7 further comprising the step of heating the implanted rotor component at a temperature of from about 600° C. to about 700° C. in the presence of oxygen to form an oxide coating having a thickness of from about 0.5 to about 3 microns on the surface of the rotor component.

12. A method for improving corrosion resistance of a turbine engine rotor component, comprising the steps of:
(a) providing a turbine engine rotor component selected from the group consisting of compressor disks, compressor seal elements, turbine disks and turbine seal elements, said rotor component being made of a nickel-base alloy and having a service operating temperature of from about 540° C. to about 815° C., said rotor component not being coated to protect it from oxidation and corrosion;
(b) implanting aluminum ions, chromium ions, or mixtures thereof into the surface of the rotor component to a depth of up to about 2 microns; and
(c) heating the implanted rotor component in the presence of oxygen to form an oxide coating on the surface of the rotor component.

13. The method of claim 12 further comprising implanting yttrium ions, cerium ions, zirconium ions, hafnium ions, or silicon ions, or mixtures thereof, on the surface of the rotor component.

14. The method of claim 12 wherein the ion implantation is conducted at a temperature of from about 20° C. to about 320° C.

15. The method of claim 14 wherein the ions are implanted to a depth of from about 0.1 to about 0.5 microns.

16. The method of claim 12 comprising the step of heating the rotor component to a temperature of from about 450° C. to about 800° C. in the presence of oxygen to form an oxide coating having a thickness of from about 0.5 to about 3 microns on the surface of the rotor component.

17. The method of claim 15 comprising the step of heating the rotor component at a temperature of from about 600° C. to about 700° C. in the presence of oxygen to form an oxide coating having a thickness of from about 0.5 to about 3 microns on the surface of the rotor component.

* * * * *